US007479696B2

(12) United States Patent
Kim et al.

(10) Patent No.: US 7,479,696 B2
(45) Date of Patent: Jan. 20, 2009

(54) INTEGRATED BST MICROWAVE TUNABLE DEVICES FABRICATED ON SOI SUBSTRATE

(75) Inventors: Il-Doo Kim, Cambridge, MA (US); Ytshak Avrahami, Arlington, MA (US); Harry L. Tuller, Wellesley, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 112 days.

(21) Appl. No.: 11/212,522

(22) Filed: Aug. 26, 2005

(65) Prior Publication Data

US 2006/0082423 A1 Apr. 20, 2006

(51) Int. Cl.
*H01L 23/34* (2006.01)

(52) U.S. Cl. ....................... 257/728; 257/347; 257/507; 257/E27.112; 257/E29.164

(58) Field of Classification Search ................. 257/347, 257/507, 728, E27.111, E27.112, E29.164
See application file for complete search history.

(56) References Cited

U.S. PATENT DOCUMENTS 6,638,872 B1 * 10/2003 Croswell et al. ............ 438/695
2002/0114957 A1 * 8/2002 Jia et al. ...................... 428/446
2003/0160329 A1 * 8/2003 Lee et al. .................... 257/760

OTHER PUBLICATIONS

Cole, M. W. et al., "Evaluation of Ta2O5 as a buffer layer film for integration of microwave tunable Bal-xSrxTiO3 based thin films with silicon substrates" Journal of Applied Physics, vol. 92, No. 7, Oct. 1, 2002, pp. 3967-3973.
Rozeau et al., "Experimental investigation of MOSFET's and coplanar waveguides on p-type high resistivity SIMOX substrate for radio-frequency applications" Proceedings 1998 IEEE International SOI Conference, Oct. 1998, pp. 27-28.
Alexe et al., "Electrical Properties of Sol-Gel deposited PbTiO3 Films on Silicon Substrates" Semiconductor Conference, 1995, Oct. 11, 1995, pp. 301-304.
Gamble et al. "Coplanar Waveguides on SOI and OPS Substrates" Proceedings of the International Society for Optical Engineering, vol. 4407, 2001, pp. 363-371.
Chouteau et al., "Optoelectronic Microswitch On SOI based Structure" Proceedings of 1995 IEEE International SOI Conference, Oct. 1995, pp. 40-41.

* cited by examiner

*Primary Examiner*—Matthew E Warren
(74) *Attorney, Agent, or Firm*—Gauthier & Connors LLP

(57) ABSTRACT

A tunable microwave device includes a SOI structure. A buffer layer is formed on the SOI structure. A microwave film layer is formed on the buffer layer. The microwave film layer comprises BST related materials.

10 Claims, 3 Drawing Sheets

INTEGRATED BST MICROWAVE TUNABLE DEVICES FABRICATED ON SOI SUBSTRATE

BACKGROUND OF THE INVENTION

The invention relates to the field of microwave tunable devices.

$(Ba,Sr)TiO_3$ (BST), Ni or Mn doped BST, $(Ba,Zr)TiO_3$ (BZT) $(Ba,Hf)TiO_3$ (BHT), $SrTiO_3$ (ST), $Bi_2(Zn_{1/3}Nb_{2/3})O_7$ (BZN) and related thin films are promising materials for tunable microwave devices applications such as electronically tunable mixers, oscillators, and phase shifters and filters. From this point on, when BST is mentioned, it is understood that it is representative of one or more related perovskite-like tunable dielectric materials. These days, the majority of research and development related to ferroelectric thin films for microwave tunable device applications are based on the BST series films grown on single crystal substrates such as MgO, $LaAlO_3$, $SrTiO_3$ and $Al_2O_3$. These substrates promote epitaxial growth of the ferroelectric thin films and provide lower substrate loss. To conveniently exploit the advantages of miniaturization and Si process compatibility, it is essential to integrate BST onto Si substrates.

SUMMARY OF THE INVENTION

According to one aspect of the invention, there is provided a tunable microwave device. The tunable microwave device includes a SOI (Silicon-On-Insulator) structure. A buffer layer is formed on the SOI structure. A microwave film layer is formed on the buffer layer. The microwave film layer comprises BST related materials.

According to another aspect of the invention, there is provided a method of developing a tunable microwave device. The method includes providing a SOI structure. A buffer layer is formed on the SOI structure. Also, the method includes forming a microwave film layer on the buffer layer. The microwave film layer comprises BST related materials.

DETAILED DESCRIPTION OF THE INVENTION

In order to integrate BST and related films onto Si substrates, several key criteria must be satisfied. First the films must be of high quality to optimize the high tunability and low dielectric loss. Higher tunability and lower loss tangent are highly desired in a high-efficiency tunable device. However, as it is not easy to obtain high tunability and low loss tangent simultaneously, compromises are needed in order to achieve both acceptable levels of tunability and loss tangent. Second, the films must be sufficiently separated from the lossy Si substrate. In principle, one could utilize high resistivity Si substrates or utilize micromachining to remove the lossy Si areas from below the microwave devices. However, these solutions lack compatibility with current Si processes and complicate integration with Si electronics on the same wafer.

Figures 1A, 1B, 1C:
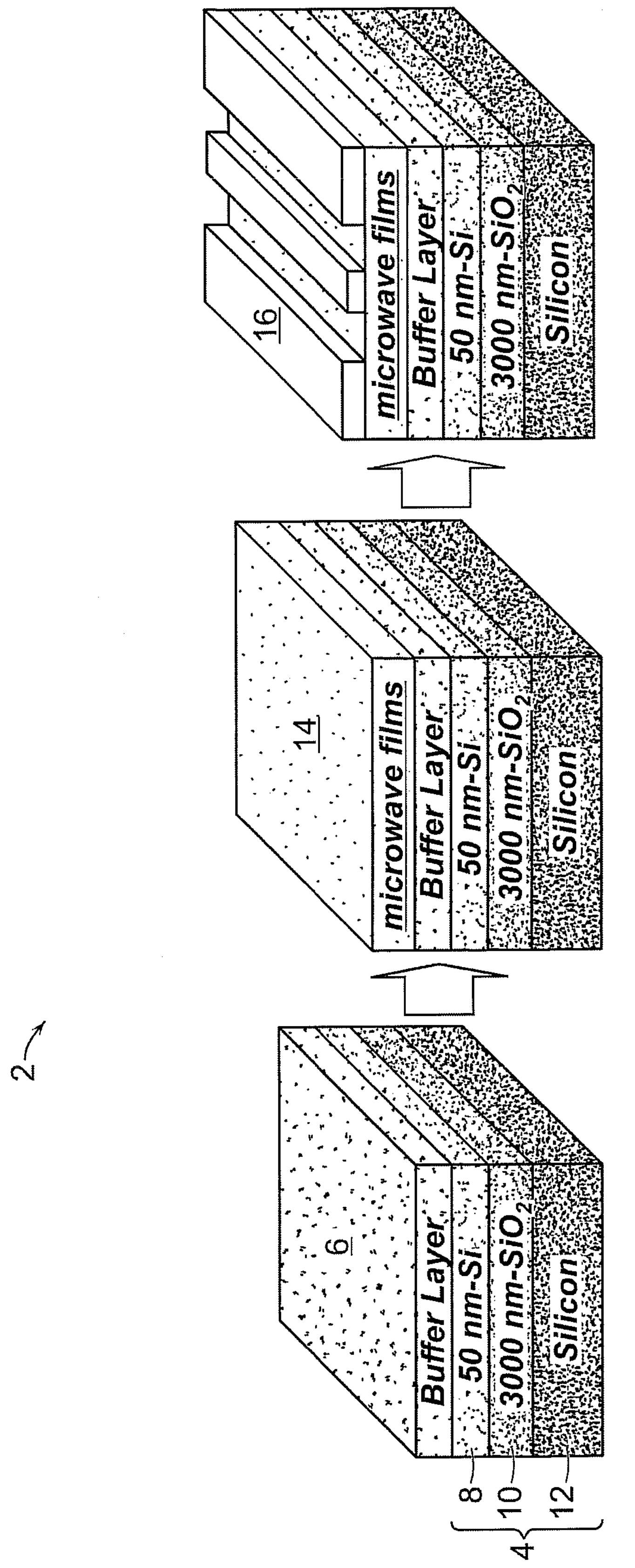
FIGS. 1A-1C are schematic diagrams illustrating a first embodiment of the invention.

FIGS. 1A-1C illustrate a first embodiment 2 of the invention. FIG. 1A shows a SOI structure 4 comprising a Si substrate 12, a $SiO_2$ layer 10, and a Si layer 8. It should be understood that other semiconducting thin films, e.g. another group IV material, a III-V material, or a II-VI material, can be coated onto the Si thin film or substituted for the Si thin film. For example, Si—Ge alloy films or GaAs can be grown onto Si and thereby serve as the "seed" layer. Alternatively, using direct wafer bonding, other semiconductors can be bonded to the $SiO_2$ layer to form a S'OI structure in which S' could be another group IV material, a III-V material, or a II-VI material.

A buffer layer 6 is formed on the SOI structure 4 using techniques described herein. FIG. 1B illustrates a microwave film layer 14 being formed on the buffer layer 6. The microwave film layer 14 can be comprised of BST, doped BST, BZT, BHT, ST, BZN, or the like and any combination of these materials. FIG. 1C shows the formation of electrodes 16 using gold (Au) on the microwave film layer 14 to complete microwave tunable circuits, e.g. coplanar waveguide (CPW) structure. Note other materials can be used to form the electrodes such as Cu, Pt, Ag.

Figures 2A, 2B, 2C:
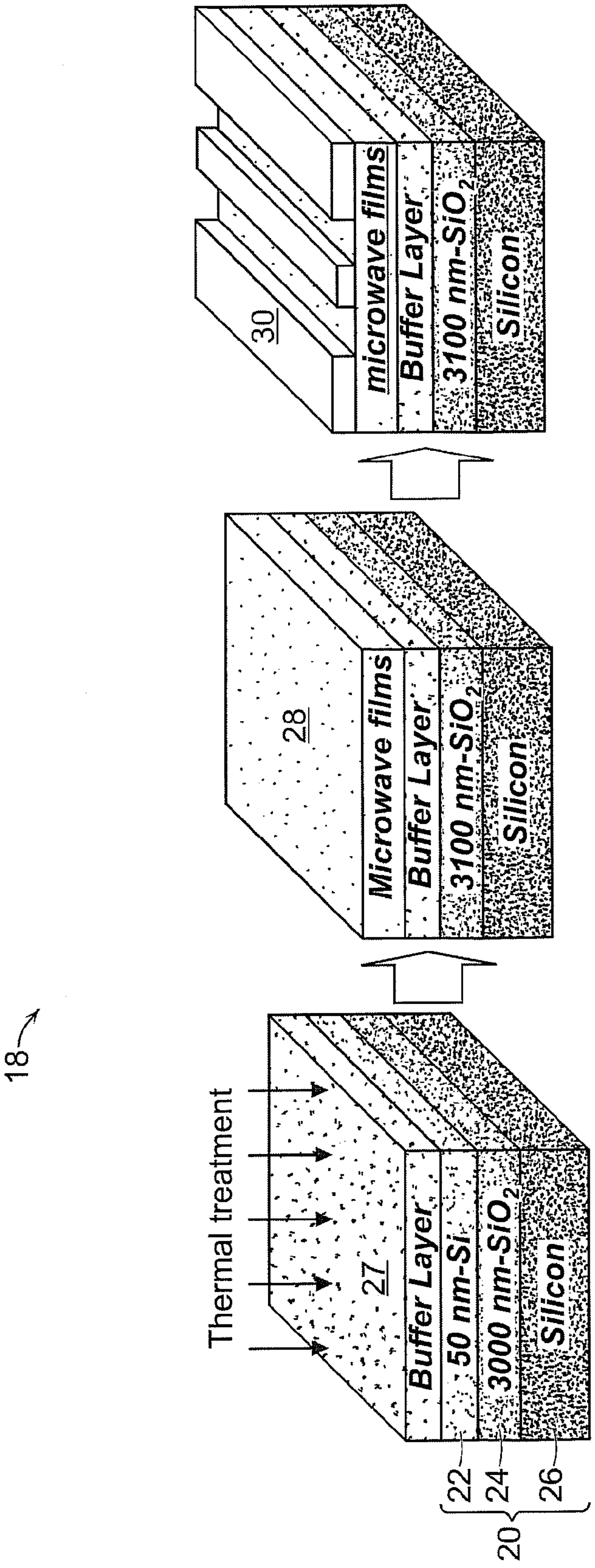
FIGS. 2A-2C are schematic diagrams illustrating a second embodiment of the invention.

FIGS. 2A-2C illustrate a second embodiment 18 of the invention. FIG. 2A shows a SOI 20 substrate comprising a Si substrate 26, a $SiO_2$ layer 24, and a Si layer 22. A buffer layer 27 is formed on the SOI substrate 20 using techniques described herein. The buffer layer 27 is then exposed to a high temperature annealing in an oxygen containing atmosphere around 600~900° C., the Si layer 22 is fully oxidized via oxygen diffusion through the buffer layer. FIG. 2B illustrates a microwave film layer 28 being formed on the buffer layer 27. The microwave film layer 28 can be comprised of BST, BZT, BHT, ST, BZN, or the like and any combination of these materials. FIG. 2C shows the formation of electrodes 30 using gold (Au) formed on the microwave film layer 28. Note other materials can be used to form the electrodes such as e.g. Cu, Pt, Ag.

Figures 3A, 3B, 3C:
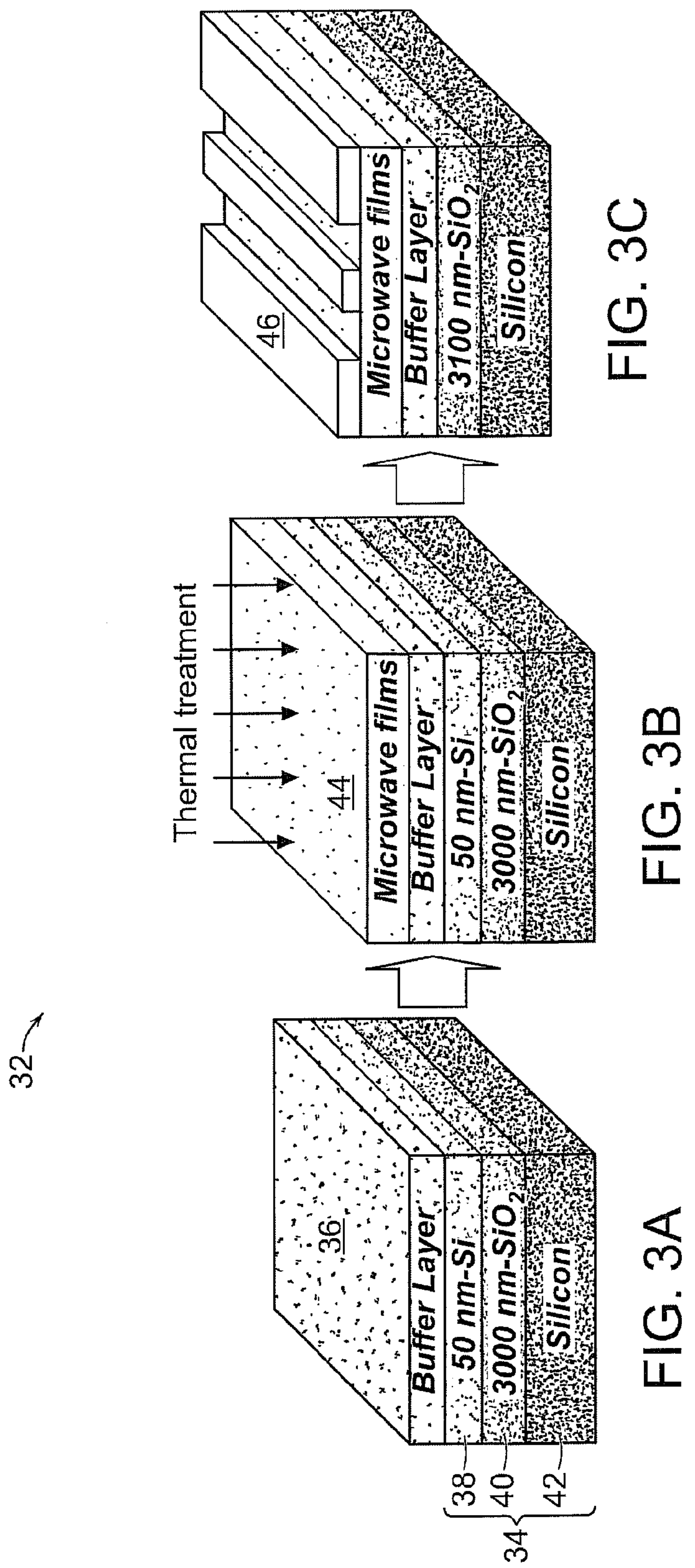
FIGS. 3A-3C are schematic diagrams illustrating a third embodiment of the invention

FIGS. 3A-3C illustrate a third embodiment 32 of the invention. FIG. 3A shows a SOI substrate 34 comprising a Si substrate 42, a $SiO_2$ layer 40, and a Si layer 38. A buffer layer 36 is formed on the SOI substrate 34 using techniques described herein. FIG. 3B illustrates a microwave film layer 44 being formed on the buffer layer 36. The microwave film layer 44 is then exposed to a high temperature annealing in an oxygen containing atmosphere around 300~900° C., the Si layer 38 is fully oxidized via oxygen diffusion through the buffer layer 36 and microwave film layer 44. The microwave film layer 44 can be comprised of layers of BST, doped BST, BZT, BHT, ST, BZN, or the like and any combination of these materials. FIG. 3C shows the formation of electrodes 46 using gold (Au) on the microwave film layer 44 to complete microwave tunable circuits, e.g. coplanar waveguide (CPW) structure. Note other materials can be used to form the electrodes such as e.g. Cu, Pt, Ag.

The SOI substrates 4, 20, 34 used in the invention can have typical dimensions of e.g. Si (less than 50 nm)/$SiO_2$(3000 nm)/Si substrate. The thin Si layer 22,38 used in the invention may be initially thicker if the oxidation steps are successful in reducing the residual Si thickness to less than or equal to approximatedly 50 nm. The 3000 nm thick $SiO_2$ will ultimately serve to isolate the microwave film layers 14, 28, 44 from the lossy Si substrates 12, 26, 42. Also one can use high resistivity (>2 kΩ) Si as a Si layer in the SOI substrates 4, 20, 34 in order to reduce conducting loss by a Si substrate. The buffer layers 6, 27, 36 have a thickness less than 200 nm, and prevent chemical reactions between the Si layers 8, 22, 38 and the microwave layers 14, 28, 44. Also, the buffer layers 6, 27, 36 are used to control the orientation and quality of the microwave film layers 14, 28, 44. The buffer layers can be comprised of MgO, $LaAlO_3$, $Al_2O_3$, YSZ, $CeO_2$, $MgAl_2O_4$, or some combination of these materials.

Also a very thin $Ba_{1-x}Sr_xTiO_3$ (x=1~0.7) seed layer (thickness less than 50 nm) can be used to control the microwave film layer orientation and film quality. If the starting SOI substrate has a Si layer thickness of greater than ~50 nm, oxidation of the Si layer can be carried out by diffusion of the oxygen from the atmosphere through the deposited layers either following the buffer layer growth or a microwave film layer film growth. Obviously, the oxidation step may be carried out even if a Si layer is less than 50 nm thick.

Although the present invention has been shown and described with respect to several preferred embodiments thereof, various changes, omissions and additions to the form and detail thereof, may be made therein, without departing from the spirit and scope of the invention.

What is claimed is:

1. A tunable microwave device comprising:

a SOI structure;

a thin layer of Si formed on said SOI structure;

a buffer layer formed on said thin layer of Si, said buffer layer includes oxidized portions of said thin layer of Si; and a microwave film layer formed on said buffer layer, wherein said microwave layer comprises BST related materials, said buffer layer comprises a thickness greater than 100 nm to prevent chemical reactions between the thin layer of Si and the microwave film layer, and to provide proper orientation and quality of the microwave film layer.

2. The tunable microwave device of claim 1, wherein said SOI structure comprises a Si substrate, $SiO_2$ layer, a second Si layer.

3. The tunable microwave device of claim 2, wherein said second Si layer is oxidized utilizing an annealing treatment on said buffer layer.

4. The tunable microwave device of claim 2, wherein said second Si layer is oxidized utilizing an annealing treatment on said microwave film layer.

5. The tunable microwave device of claim 1, wherein said BST related materials comprise $(Ba,Sr)TiO_3$ (BST), Ni or Mn doped BST, $(Ba,Zr)TiO_3$ (BZT) $(Ba,Hf)TiO_3$ (BHT), $SrTiO_3$ (ST), or $Bi_2(Zn_{1/3}Nb_{2/3})O_7$ (BZN).

6. The tunable microwave device of claim 1, wherein said buffer layer comprises MgO, $MgAl_2O_4$, $Al_2O_3$, $LaAlO_3$, LSAT $(LaAlO_3)_{0.3})$ $(Sr_2AlTaO_6)_{0.7}$, $CeO_2$, $Y_2O_3$, YSZ, BaO, SrO, $Ba_{1-x}Sr_xO$, $SrTiO_3$, $Pb_xBa_{1-x}TiO_3$, $TiO_2$, $Ta_2O_5$.

7. The tunable microwave device of claim 1, wherein a buffer layer formed on said SOI structure has a thickness selected from a range approximately 20 nm to approximately 200 nm.

8. The tunable microwave device of claim 2, wherein said second Si layer comprises less than or equal to approximately 100 nm.

9. The tunable microwave device of claim 2, wherein said second Si layer can be replaced by a material selected from the group consisting of group IV material, a III-V material, a II-VI material, and high resistivity Si (>2 kΩ).

10. The tunable microwave device of claim 2, wherein said $SiO_2$ layer is typically greater than 2000 nm.

* * * * *

UNITED STATES PATENT AND TRADEMARK OFFICE

CERTIFICATE OF CORRECTION

PATENT NO. : 7,479,696 B2
APPLICATION NO. : 11/212522
DATED : January 20, 2009
INVENTOR(S) : Kim et al.

It is certified that error appears in the above-identified patent and that said Letters Patent is hereby corrected as shown below:

Please insert the following on the Title page of the issued patent:

--Related U.S. Application Data

(60) Provisional application No. 60/607,690, filed on September 7, 2004.--

Signed and Sealed this

Third Day of March, 2009

JOHN DOLL
*Acting Director of the United States Patent and Trademark Office*